United States Patent
Nagano et al.

(10) Patent No.: US 8,797,738 B2
(45) Date of Patent: Aug. 5, 2014

(54) POWER CONVERTING APPARATUS

(75) Inventors: Sumiaki Nagano, Kitakyushu (JP);
Kazutaka Kishimoto, Kitakyushu (JP);
Makoto Kojyo, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 176 days.

(21) Appl. No.: 13/444,846

(22) Filed: Apr. 12, 2012

(65) Prior Publication Data

US 2012/0262968 A1   Oct. 18, 2012

(30) Foreign Application Priority Data

Apr. 18, 2011   (JP) ................. 2011-091906

(51) Int. Cl.
*H05K 7/20* (2006.01)
*H02M 7/00* (2006.01)
*H05K 7/14* (2006.01)

(52) U.S. Cl.
CPC ............. *H02M 7/003* (2013.01); *H05K 7/1432* (2013.01); *H05K 7/20918* (2013.01)
USPC ........... 361/690; 361/678; 174/547; 174/668; 363/141

(58) Field of Classification Search
USPC .................. 361/678, 690; 174/547, 668–669; 363/141
See application file for complete search history.

(56) References Cited

U.S. PATENT DOCUMENTS

| | | | |
|---|---|---|---|
| 5,091,823 A | 2/1992 | Kanbara et al. | |
| 5,728,974 A * | 3/1998 | Kitoh et al. | 174/658 |
| 6,867,371 B2 * | 3/2005 | Daoud et al. | 174/652 |
| 6,963,030 B2 * | 11/2005 | Matsui et al. | 174/377 |
| 7,534,965 B1 * | 5/2009 | Thompson | 174/153 G |
| 7,616,442 B1 * | 11/2009 | Kaveh | 361/697 |
| 2005/0139372 A1 | 6/2005 | Matsui et al. | |
| 2010/0079944 A1 * | 4/2010 | Loth | 361/695 |

FOREIGN PATENT DOCUMENTS

| | | |
|---|---|---|
| EP | 2170029 | 3/2010 |
| JP | 61-044496 | 3/1986 |
| JP | 2703065 B2 | 11/1990 |
| JP | 2003-004170 | 1/2003 |

OTHER PUBLICATIONS

Japanese Office Action for corresponding JP Application No. 2011-091906, Jun. 12, 2013.
Chinese Office Action for corresponding CN Application No. 201210086622.1, Feb. 8, 2014.

* cited by examiner

*Primary Examiner* — Robert J Hoffberg
(74) *Attorney, Agent, or Firm* — Mori & Ward, LLP

(57) ABSTRACT

A power converting apparatus includes a housing, a cable, and a grommet supporting member. The housing includes a housing base, a main body, and an air duct. The housing base has a first surface and a second surface and includes a through hole. The main body includes a plurality of electronic components on the first surface of the housing base. The air duct is disposed on the second surface of the housing base, and cooling air flows through the air duct. The cable is disposed through the through hole of the housing base so as to be wired between the main body and the air duct. The grommet supporting member is in the air duct or the main body. The grommet supporting member supports a grommet through which the cable is disposed. The grommet supporting member is not integral with the housing base.

17 Claims, 11 Drawing Sheets

POWER CONVERTING APPARATUS

CROSS-REFERENCE TO RELATED APPLICATIONS

The present application claims priority under 35 U.S.C. §119 to Japanese Patent Application No. 2011-091906, filed Apr. 18, 2011. The contents of this application are incorporated herein by reference in their entirety.

BACKGROUND OF THE INVENTION

1. Field of the Invention

The present invention relates to a power converting apparatus configured to convert direct current power into alternating current power or convert alternating current power into direct current power.

2. Discussion of the Background

As disclosed in Japanese Unexamined Patent Publication No. 2003-4170, a conventional waterproof structure of a cable inlet portion includes a grommet entirely formed of rubber and fitted into a through hole on a wall of a structure. A cable passes through the grommet.

SUMMARY OF THE INVENTION

According to one aspect of the present invention, a power converting apparatus is configured to convert alternating current power into direct current power or convert direct current power into alternating current power. The power converting apparatus includes a housing, a cable, and a grommet supporting member. The housing includes a housing base, a main body, and an air duct. The housing base has a first surface and a second surface and includes a through hole. The main body includes a plurality of electronic components on the first surface of the housing base. The air duct is disposed on the second surface of the housing base, and cooling air flows through the air duct. The cable is disposed through the through hole of the housing base so as to be wired between the main body and the air duct. The grommet supporting member is in at least one of the air duct and the main body. The grommet supporting member supports a grommet through which the cable is disposed. The grommet supporting member is not integral with the housing base.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
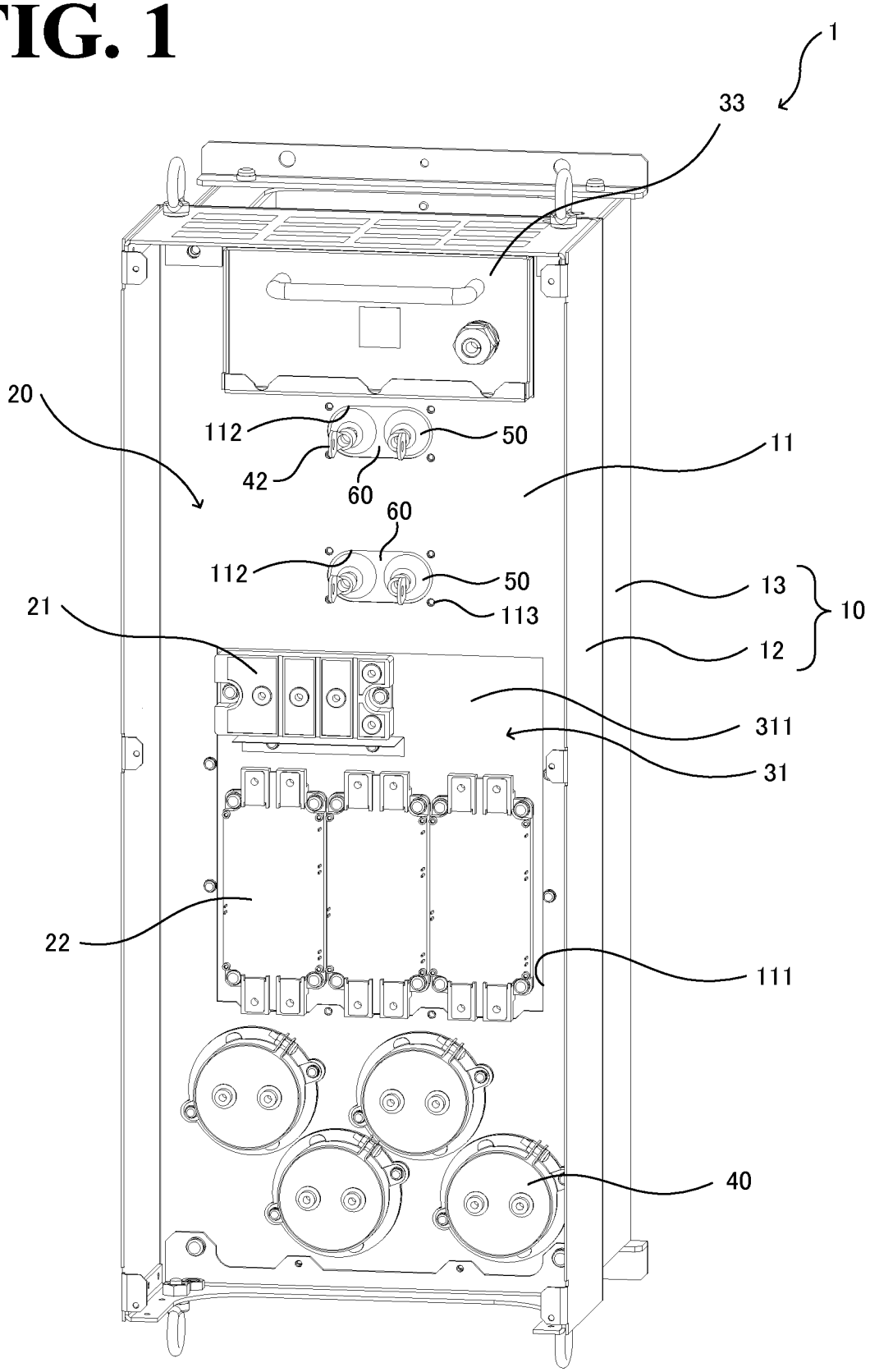
FIG. 1 is a perspective view a power converting apparatus according to an embodiment illustrating an internal structure of the power converting apparatus on the main body side.

The embodiments will now be described with reference to the accompanying drawings, wherein like reference numerals designate corresponding or identical elements throughout the various drawings.

Figure 2:
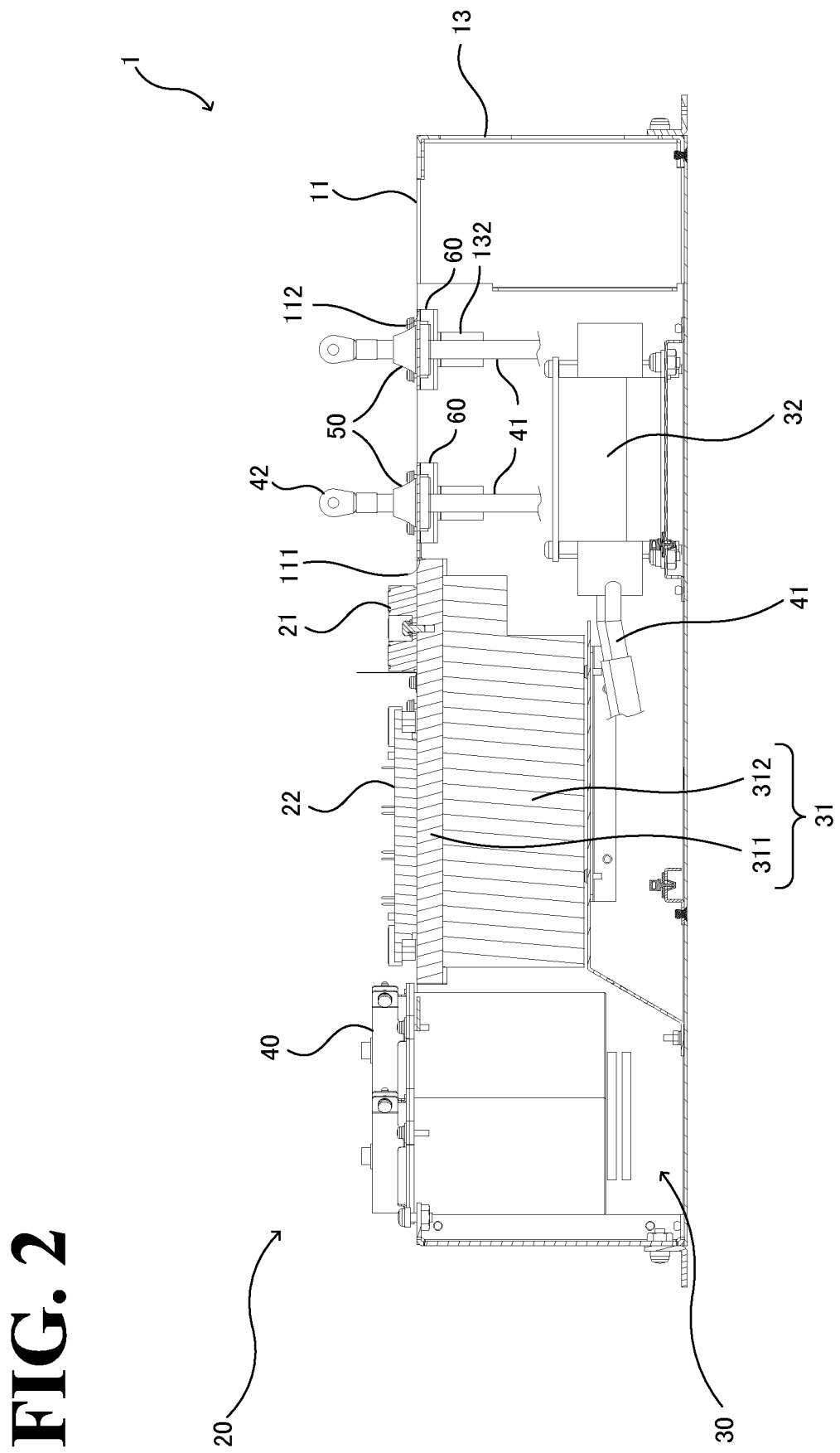
FIG. 2 is a longitudinal sectional view of the power converting apparatus according to the embodiment illustrating an internal structure of the power converting apparatus on the air duct side.
Figure 3:
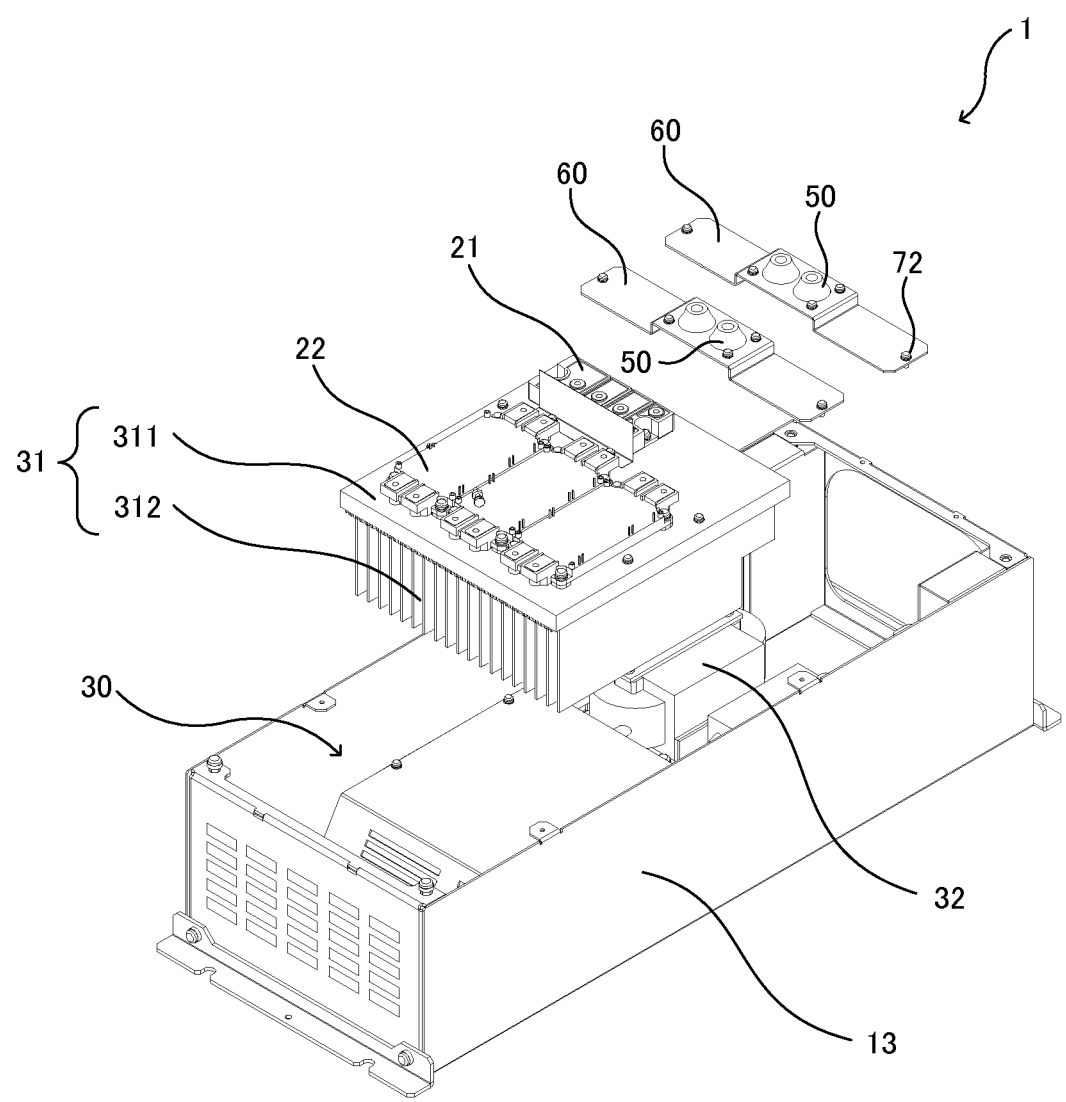
FIG. 3 is a perspective view of the power converting apparatus according to the embodiment illustrating an internal structure of the power converting apparatus on the air duct side.

As shown in FIGS. 1 to 3, a power converting apparatus 1 according to this embodiment is an inverter device to convert direct current power into alternating current power. The power converting apparatus 1 includes a housing 10, a main body 20, an air duct 30, and cylindrical capacitors 40. The housing 10 includes a housing base 11. The main body 20 is disposed on the front surface of the housing base 11 (in other words, on one surface of the housing base 11, as seen on the front-left side of the paper surface of FIG. 1, and the upper side in FIGS. 2 and 3). The air duct 30 is disposed on the rear surface of the housing base 11 (in other words, on the other surface of the housing base 11, as seen on the rear-right side of the paper surface of FIG. 1, and the lower side in FIGS. 2 and 3). Cooling air flows through the air duct 30. In the following description, the term "width direction" means the width direction of the housing 10 (that is, the right-to-left direction in FIG. 1).

The housing 10 includes a main body housing piece 12 and an air duct housing piece 13. The main body housing piece 12 encloses the main body 20 side, while the air duct housing piece 13 encloses the air duct 30 side. The rear surface of the main body housing piece 12 constitutes the housing base 11, so that the housing base 11 serves as a partition wall to separate the main body 20 and the air duct 30 from one another. In FIGS. 2 and 3, the illustration of the main body housing piece 12 is omitted.

The main body 20 includes a plurality of electronic components including diode modules 21 and power modules 22. The diode modules 21 and the power modules 22 are tightly secured to the front surface of a base portion 311 of a heat sink 31, described later (in other words, to the surface on the front left side of the paper surface of FIG. 1, and the surface on the upper side in FIGS. 2 and 3). The diode modules 21 rectify alternating current power fed from an alternating current power source, not shown, so as to covert the alternating current power into direct current power and to output the direct current power. The power modules 22 include a plurality of switching elements incorporating semiconductor devices such as IGBTs (Insulated Gate Bipolar Transistors). The plurality of switching elements repeat conductions and shutoffs in respective appropriate orders so as to output alternating current power of predetermined frequencies.

In the air duct 30, the heat sink 31, two reactors 32, and a fan unit 33 are disposed. The two reactors 32 smooth the pulsation of the current of the direct current power converted from the alternating current power. The fan unit 33 generates cooling air. The heat sink 31 is made of a material with high heat conductivity (examples including, but not limited to, an aluminum alloy). The heat sink 31 includes a base portion 311 and a plurality of fins 312. The base portion 311 is mounted to the housing base 11 so as to close an opening 111 of the housing base 11. The plurality of fins 312 are upright on the rear surface of the base portion 311 (in other words, on the surface on the rear-right side of the paper surface of FIG. 1, and the surface on the lower side in FIGS. 2 and 3). In the heat sink 31, the heat of the diode modules 21 and the power modules 22, which are tightly secured to the front surface of the base portion 311, is radiated through the plurality of fins 312. Thus, the diode modules 21 and the power modules 22 are cooled.

The capacitors 40 smooth the direct current power converted from the alternating current power by the diode modules 21. The capacitors 40 penetrate the housing base 11 such that part of each of them is disposed in the main body 20 and the rest of each of them is disposed in the air duct 30. In FIG. 3, the illustration of the capacitors 40 is omitted.

In the power converting apparatus 1, cables 41 serving as lead wires for the reactors 32 pass through a through hole 112, which is disposed on the housing base 11, so as to be wired between the main body 20 and the air duct 30. Two cables 41 are wired to each reactor 32, and a total of four cables 41 pass through respective cable insertion grommets 50 at the penetrating portion. Each of the cables 41 has, at its end, a terminal 42. The grommets 50 are supported by respective grommet supporting members 60 disposed in the air duct 30. The grommet supporting members 60 are not integral with the housing base 11. In FIG. 3, the illustration of the cables 41 is omitted.

The grommet supporting members 60 will be described in detail by referring to FIGS. 4 to 6.

Figure 5A:
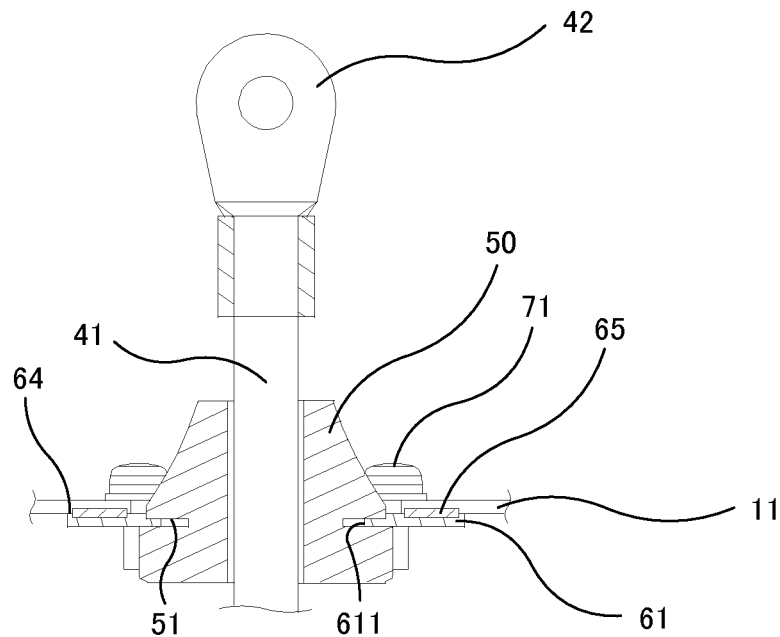
FIG. 5A is a cross sectional view taken along the line VA-VA of FIG. 4.
Figure 5B:
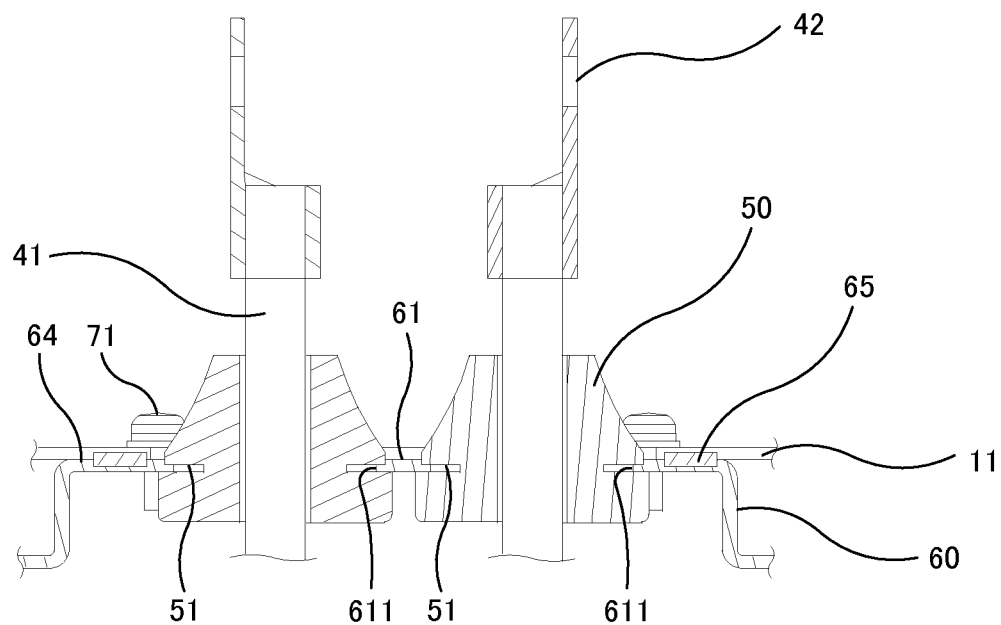
FIG. 5B is a cross sectional view taken along the line VB-VB of FIG. 4.
Figure 6:
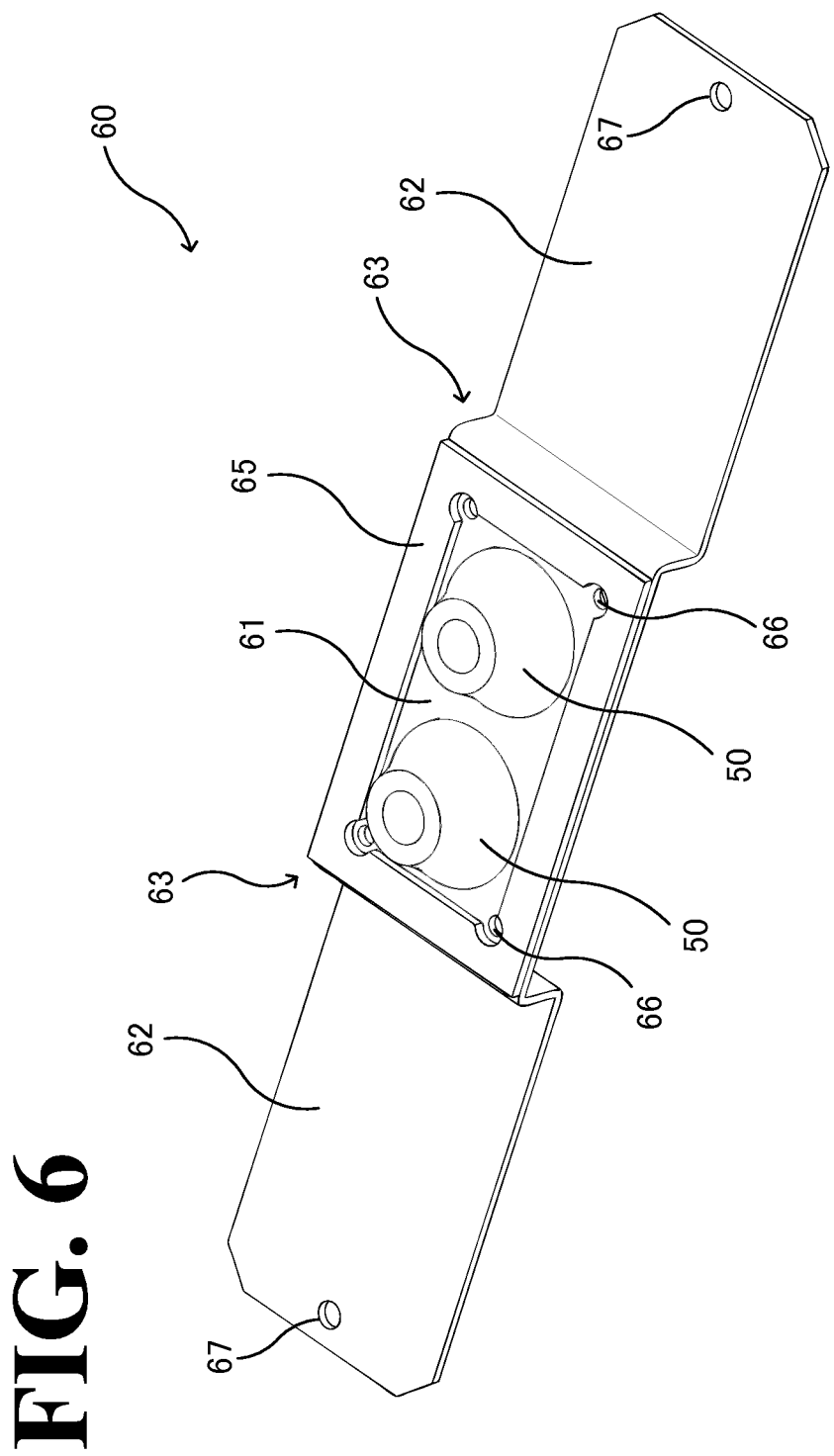
FIG. 6 is a perspective view of a grommet supporting member illustrating its entire structure.

As shown in FIG. 6, the grommet supporting member 60 includes a holder 61 and linkages 62 integral with the holder 61. The holder 61 permits two grommets 50 to pass through the holder 61 so as to hold the two grommets 50. The linkages 62 are disposed on both sides of the holder 61 in the width direction so as to couple the holder 61 and the air duct housing piece 13 to one another. Between the holder 61 and each of the linkages 62, a stepped portion 63 is disposed to ensure that with the grommet supporting member 60 mounted to the air duct housing piece 13, the holder 61 is closer to the housing base 11 than the linkages 62 are to the housing base 11. This brings an edge portion 64 (see FIGS. 5A and 5B) of the holder 61 into contact with the circumference of the through hole 112 on the back surface of the housing base 11 (on the surface on the lower side in FIGS. 5A and 5B). As shown in FIGS. 5A, 5B, and FIG. 6, a gasket 65 in the form of an approximately square frame is disposed on the edge portion 64.

As shown in FIGS. 5A and 5B, the holder 61 has through holes 611 for the grommets 50. Each of the through holes 611 has a diameter smaller than the outer diameter of each of the grommets 50. The edge portion of each of the through holes 611 is fitted in a cut-in portion 51 formed on each of the grommets 50, so that the grommets 50 are held by the holder 61. To facilitate the work of fitting the grommet 50 with the through hole 611, the cut-in portion 51 has a depth with an additional predetermined margin. This ensures that the grommet 50, when fitted with the through hole 611, is movable along the plane of the holder 61 within the margin.

Figure 4:
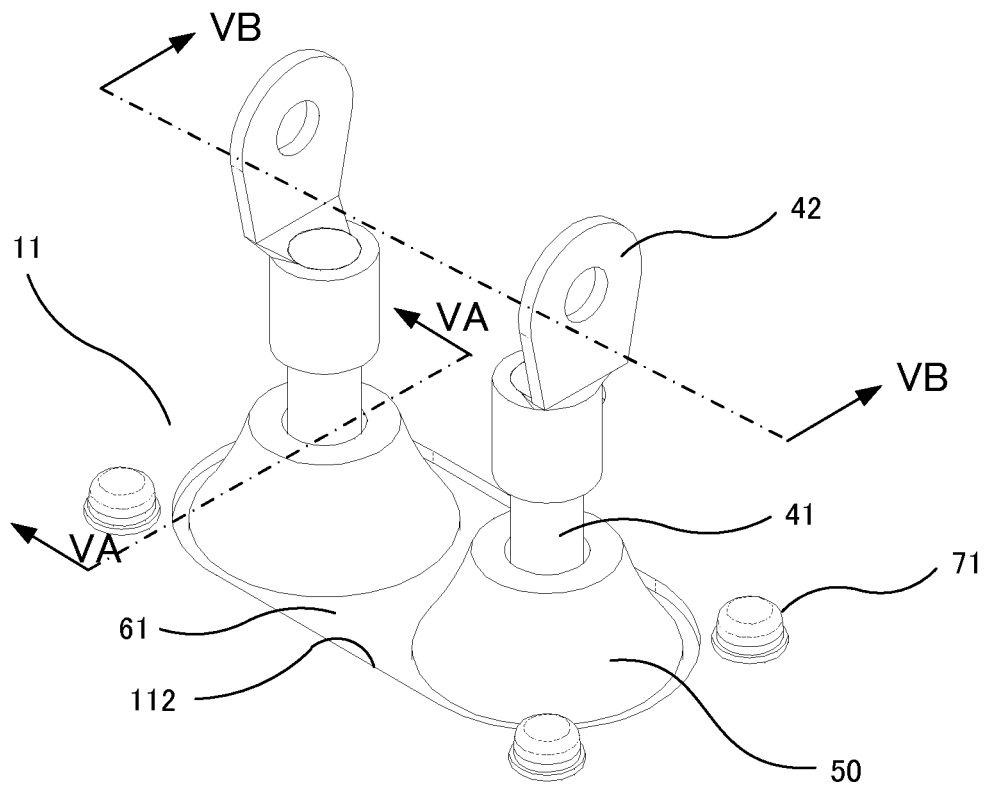
FIG. 4 is an enlarged perspective view of a cable penetrating portion of a housing base.

The holder 61 includes, on its four corners, screw holes 66 for securing screws 71 (see FIGS. 4, 5A, and 5B). The housing base 11 includes insertion holes 113 at positions corresponding to the screw holes 66 (see FIG. 1). The fixing screws 71 are inserted through the insertion holes 113 of the housing base 11 from the main body 20 side to be joined to the screw holes 66. This ensures that the edge portion 64 of the holder 61 is brought into close contact with the housing base 11 across the gasket 65, and that the grommet supporting member 60 hermetically seals the through hole 112 of the housing base 11. The edge portion 64 corresponds to the close contact portion recited in the claims.

Each of the linkages 62 includes, at its end portion on the air duct housing piece 13 side, an insertion hole 67 for a securing screw 72 (see FIG. 3). The air duct housing piece 13 includes housing side walls 131 on both sides of the air duct housing piece 13 in the width direction (see FIGS. 2 and 7). On each of the housing side walls 131, L-shaped mounting members 132 are disposed (see FIGS. 2 and 7). Each of the mounting members 132 includes a screw hole 133 (see FIG. 7) for the fixing screw 72. The fixing screw 72 is inserted through the insertion hole 67 of the linkage 62 to be joined to the screw hole 133 of the mounting member 132. Thus, the linkages 62 couple the holder 61 to the housing side walls 131, thereby securing the entire grommet supporting member 60 to the air duct housing piece 13.

Referring to FIGS. 7 to 11, description will be made with regard to the assembly work of the waterproof structure of the cable penetrating portion in the power converting apparatus 1.

Figure 7:
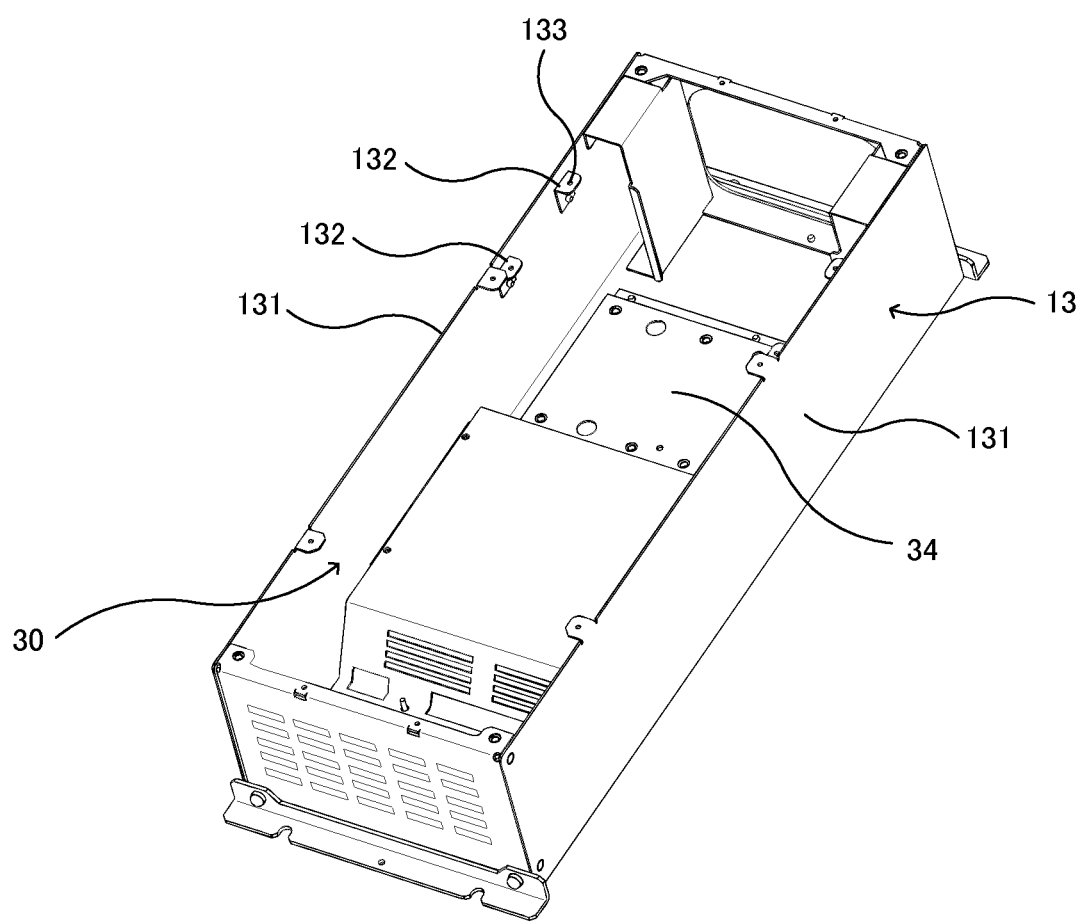
FIG. 7 is a perspective view of an air duct housing piece illustrating its internal structure prior to mounting of reactors.
Figure 8:
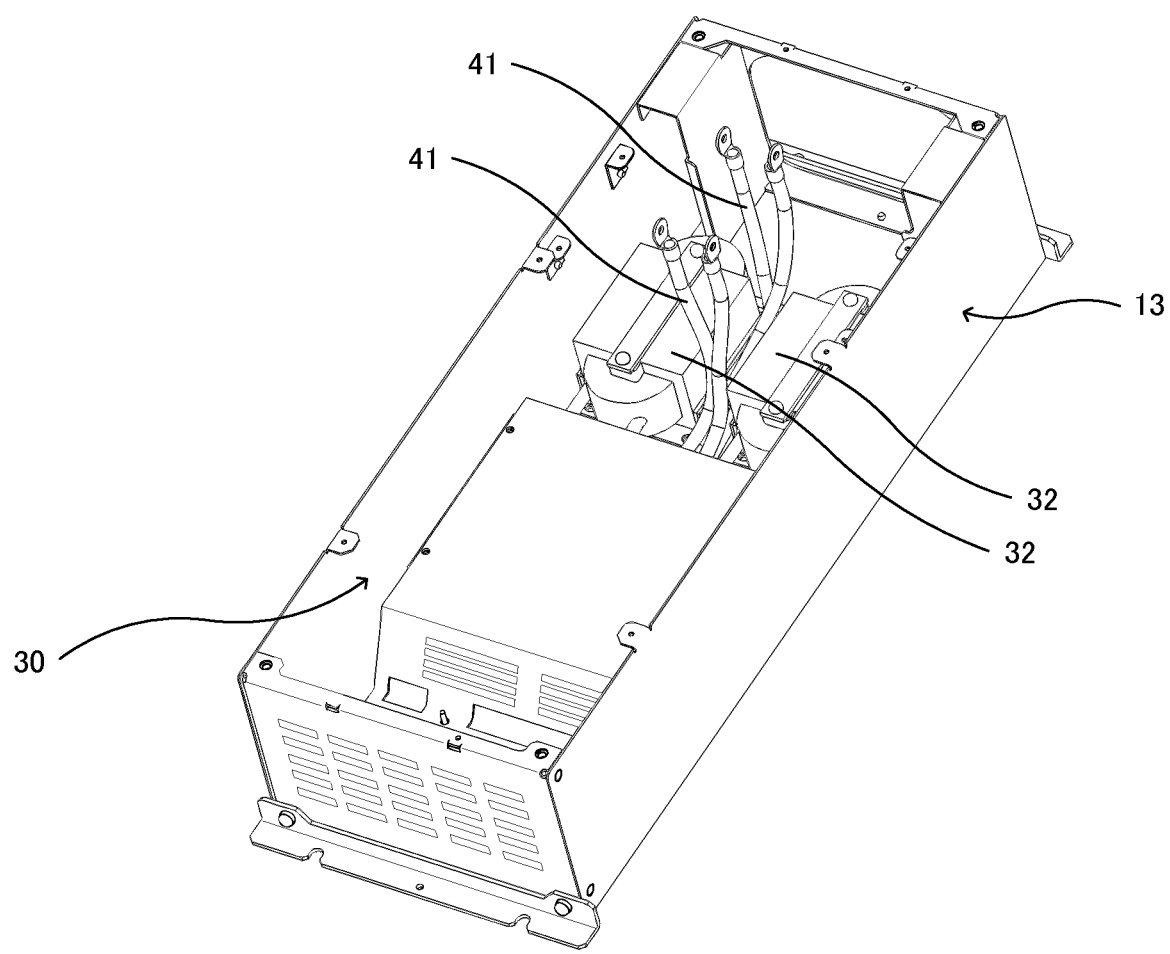
FIG. 8 is a perspective view of the an air duct housing piece illustrating its internal structure after mounting of the reactors.
Figure 9:
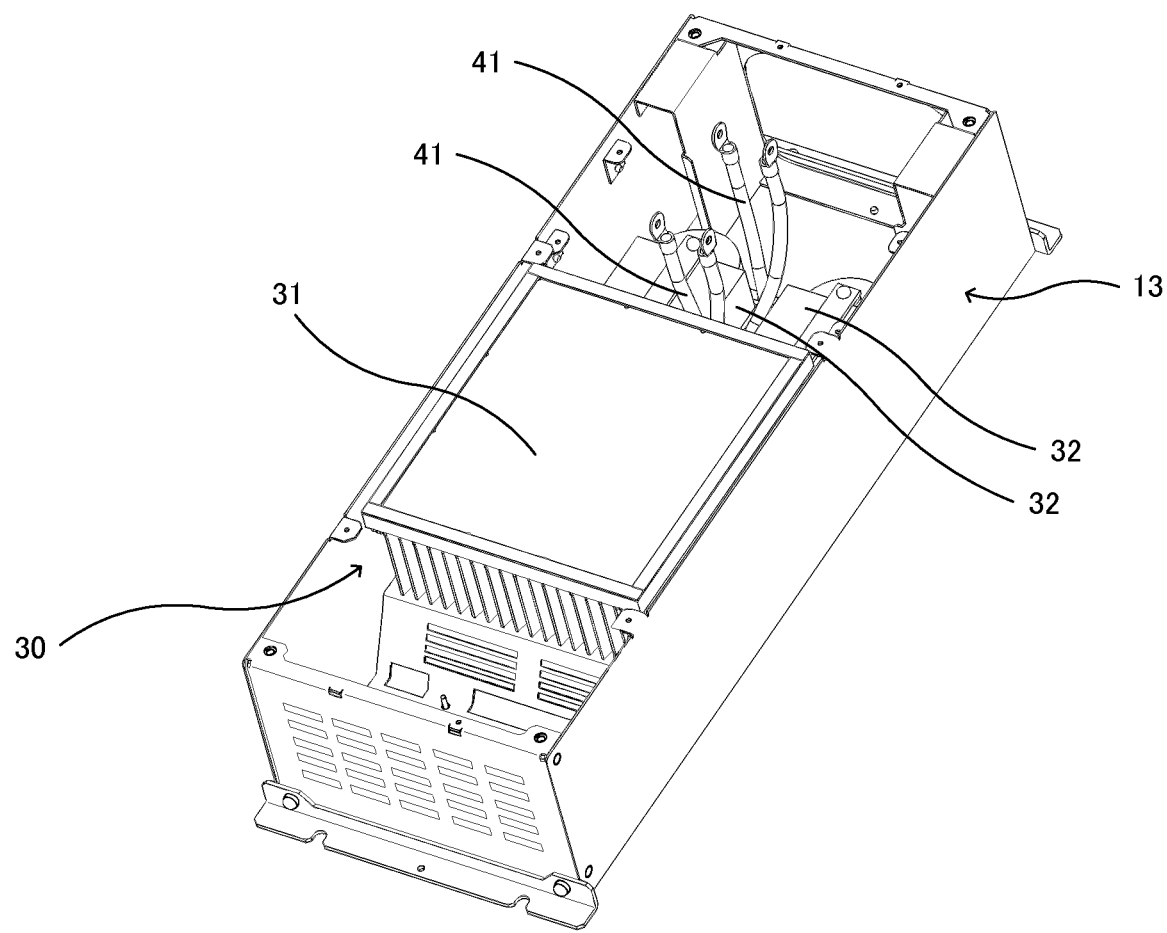
FIG. 9 is a perspective view of the an air duct housing piece illustrating its internal structure after mounting of a heat sink.

As shown in FIG. 7, in the air duct housing piece 13, a reactor base 34 is disposed where reactors 32 are to be mounted. On the reactor base 34 shown in FIG. 7, two reactors 32 are mounted, as shown in FIG. 8. As described above, each reactor 32 uses two cables 41 as lead wires, and a total of four cables 41 are drawn. In FIG. 8, the cables 41 are upright (which is a state of being supported by the grommet supporting member 60) for the sake of description. In operation, however, the cables 41 are disposed on the bottom portion of the air duct housing piece 13. The same applies to FIG. 9. As shown in FIG. 9, the heat sink 31 is disposed in the air duct housing piece 13.

Figure 10:
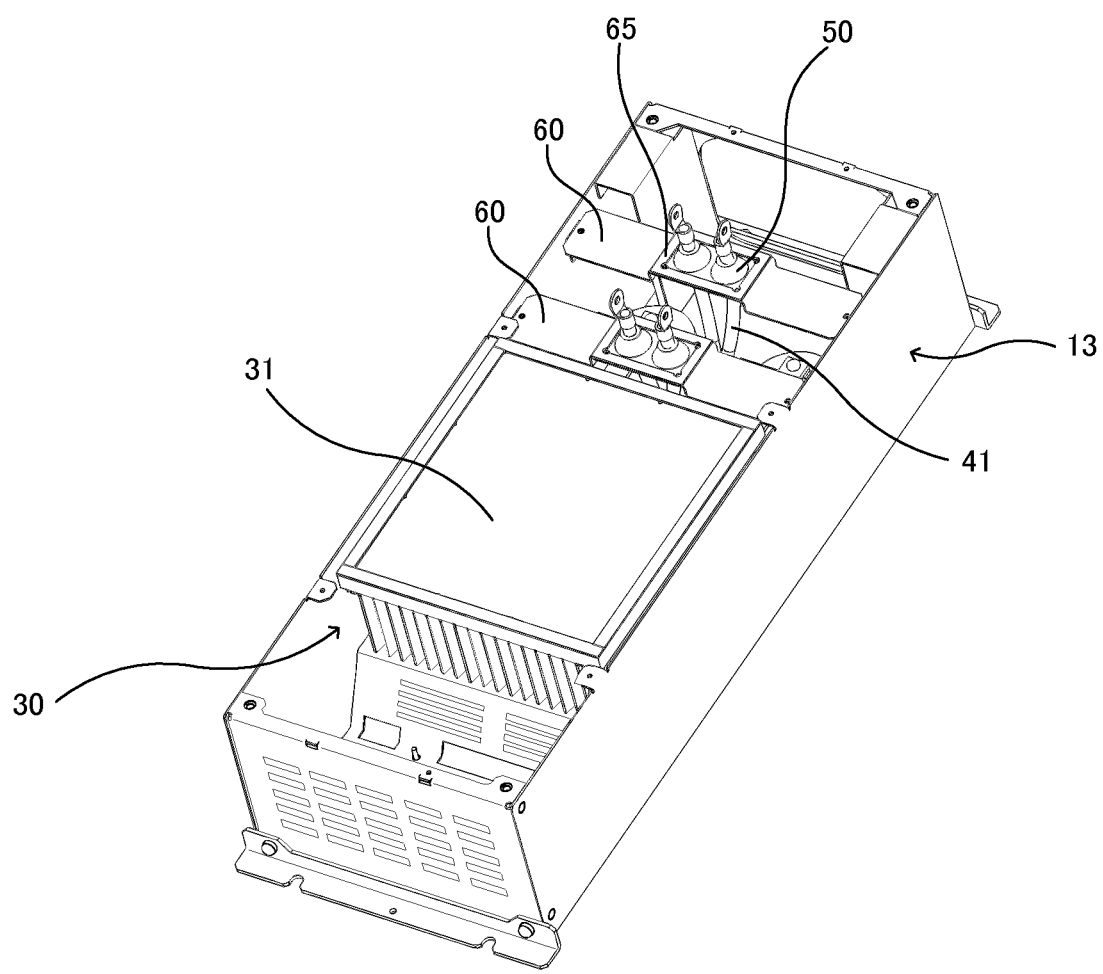
FIG. 10 is a perspective view of the an air duct housing piece illustrating its internal structure after mounting of a grommet supporting member.

As shown in FIG. 10, the grommet supporting members 60, each having the grommets 50 mounted to the holder 61, are attached inside the air duct housing piece 13 via the mounting members 132. Then, the cables 41 are inserted through the grommets 50 supported by the grommet supporting members 60. Here, the main body housing piece 12, which includes the housing base 11, is not currently mounted to the air duct housing piece 13. This permits the worker to grasp the cables 41 disposed in the air duct 30, which facilitates the insertion of the cables 41 through the respective grommets 50. The procedure shown in FIGS. 9 through 10 may be reversed. Specifically, it is possible to first mount the grommet supporting member 60 to the air duct housing piece 13, then insert the cables 41 through the grommet supporting member 60, and finally mount the heat sink 31.

Figure 11:
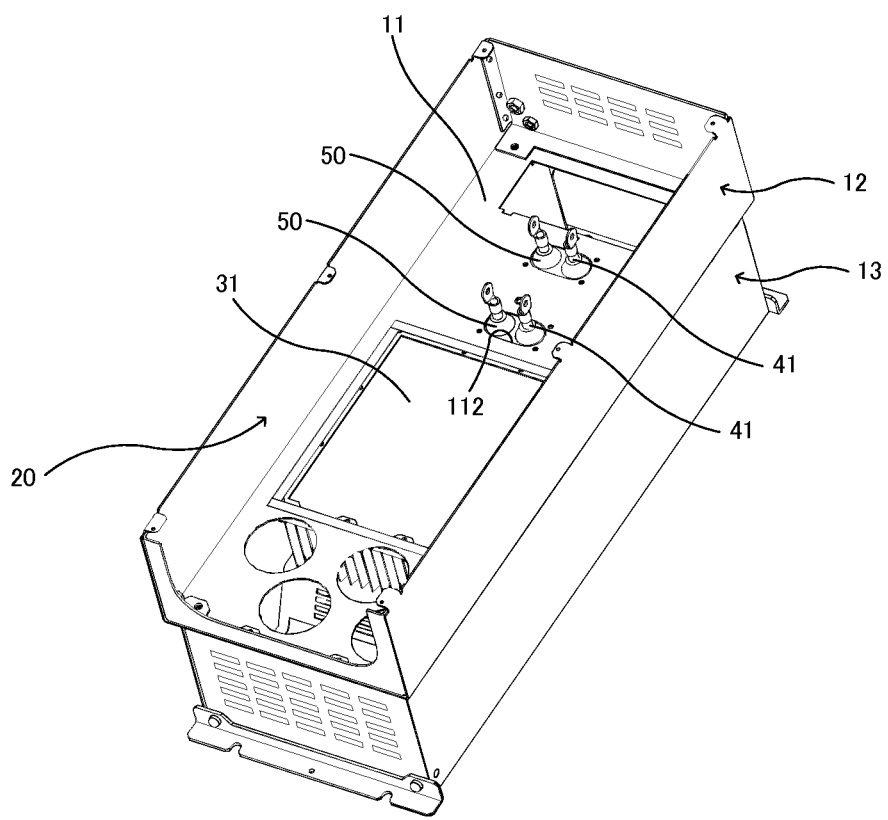
FIG. 11 is a perspective view of the housing with a main body housing piece mounted to the air duct housing piece.

Subsequently, as shown in FIG. 11, the main body housing piece 12 is mounted to the air duct housing piece 13 with the cables 41 inserted through the through hole 112 of the housing base 11. This, as described above, ensures that the edge portion 64 of the holder 61 of the grommet supporting member 60 is brought into close contact with the housing base 11 across the gasket 65, and the through hole 112 of the housing base 11 is thereby hermetically sealed. While in this embodiment the heat sink 31 is mounted before the mounting of the main body housing piece 12, the heat sink 31 may be mounted after the mounting of the main body housing piece 12.

Thus, in the power converting apparatus 1 according to this embodiment, the cables 41 serving as lead wires for the reactors 32 are inserted through the through hole 112, which is disposed on the housing base 11, so as to be wired between the main body 20 and the air duct 30. The grommets 50, through which the cables 41 are inserted, are supported by the grommet supporting member 60. The grommet supporting member 60 is disposed in the air duct 30 and is not integral with the housing base 11. The assembly work of the waterproof structure of the cable penetrating portion thus configured is as shown in FIGS. 10 and 11. The grommet supporting member 60 with the grommets 50 mounted thereto is mounted to the air duct 30, and then the cables 41 are inserted through the respective grommets 50. Then, the main body housing piece 12 is mounted to the air duct housing piece 13 with the cables 41 inserted through the through hole 112.

The main body housing piece 12 has approximately the same size as that of the air duct housing piece 13, and when the main body housing piece 12 is not mounted to the air duct housing piece 13, in other words, when the opening of the air duct housing piece 13 on the housing base 11 side is not covered, the worker is able to grasp the cables 41 disposed in the air duct 30 when inserting the cables 41 through the respective grommets 50 supported by the grommet supporting member 60. At this moment, the main body housing piece 12 is not disposed on the air duct housing piece 13, and this makes the cables 41 clearly observable and facilitates the insertion of the worker's arm into the air duct 30. This facilitates the insertion of the cables 41 through the respective grommets 50, thereby improving the assembly workability of the waterproof structure of the cable penetrating portion.

It is particularly noted that in this embodiment, the grommet supporting member 60 hermetically seals the through hole 112 of the housing base 11. This ensures a reliable waterproof structure for the cable penetrating portion with the grommets 50 supported by the grommet supporting member 60. This in turn eliminates or minimizes intrusion of air, dust, and water droplets into the main body 20 from the air duct 30.

It is particularly noted that in this embodiment, the grommet supporting member 60 includes the holder 61 and the linkages 62. The holder 61 permits the grommets 50 to pass through the holder 61 so as to hold the grommets 50. The linkages 62 couple the holder 61 and the air duct housing piece 13 to one another. The edge portion 64 of the holder 61 is in close contact with the circumference of the through hole 112 of the housing base 11. The close contact of the edge portion 64 ensures hermetic sealing of the through hole 112 of the housing base 11. In addition, the gasket 65 is disposed on the edge portion 64 of the holder 61. This further improves the hermetic sealability of the through hole 112 of the housing base 11 by the grommet supporting member 60.

It is particularly noted that in this embodiment, the linkages 62 couple the holder 61 of the grommet supporting member 60 to the housing side walls 131, which are disposed on the respective sides of the holder 61 in the width direction. That is, the grommet supporting member 60 is bridged between the housing side walls 131, which are disposed on the respective sides of the grommet supporting member 60 in the width direction. This ensures a firm supporting structure of the grommets 50. Additionally, the grommet supporting member 60 also serves as a reinforcing member for the air duct housing piece 13. This provides an additional advantageous effect of improving the strength of the air duct housing piece 13 in the width direction.

It is particularly noted that in this embodiment, the grommet supporting member 60 supports a plurality of grommets 50 (two grommets 50 in the above example). This reduces the number of grommet supporting members 60 as compared with a single grommet supporting member 60 supporting a single grommet 50 (which requires the same number of the grommet supporting members 60 as the number of the grommets 50). This in turn reduces the piece-part count and the steps count for assembly. It is particularly noted that in this embodiment, each grommet supporting member 60 supports two cables 41 of a corresponding one of the reactors 32. This ensures a clear correspondence between a reactor 32 and a grommet supporting member 60, and ensures well organized wiring of the cables 41 in the air duct 30.

While in the above-described embodiment the cables 41 serve as lead wires for the reactors 32, the cables 41 may serve any other purposes insofar as the cables 41 pass through the housing base 11 and are wired between the main body 20 and the air duct 30.

While in the above-described embodiment the grommet supporting member 60 is disposed in the air duct 30, this should not be construed in a limiting sense. For example, in such assembly work that the air duct housing piece 13 is mounted to the main body housing piece 12 when it is the air duct housing piece 13 that has the housing base 11, disposing the grommet supporting member 60 in the main body 20 provides similar advantageous effects to those in the above-described embodiment.

While in the above-described embodiment two reactors 32 are disposed in the air duct 30, it is also possible to dispose a single reactor 32 or three or more reactors 32. In each case, all that is necessary is to dispose the same number of grommet supporting members 60 as the number of the reactors 32.

While in the above-described embodiment each grommet supporting member 60 supports two grommets 50, each grommet supporting member 60 may support three or more grommets 50. When a small number of cables are to be wired through the housing base 11, the grommet supporting member 60 may support a single grommet 50.

While in the above-described embodiment the power converting apparatus 1 is an inverter device to convert direct current power into alternating current power, this should not be construed in a limiting sense. The power converting apparatus may be a converter device to convert alternating current power into direct current power.

It will be appreciated that various embodiments and modifications described herein may be readily combined.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A power converting apparatus configured to convert alternating current power into direct current power or convert direct current power into alternating current power, the power converting apparatus comprising:
    a housing comprising:
        a housing base having a first surface and a second surface and comprising a through hole;
        a main body comprising a plurality of electronic components on the first surface of the housing base; and
        an air duct through which cooling air flows on the second surface of the housing base;
    a cable disposed through the through hole of the housing base so as to be wired between the main body and the air duct; and
    a grommet supporting member in at least one of the air duct or the main body, the grommet supporting member supporting a grommet through which the cable is disposed, the grommet supporting member being not integral with the housing base, wherein the grommet supporting member comprises:
a holder through which the grommet is disposed so as to hold the grommet, the holder comprising a close contact portion extending parallel to and in close contact with a circumference of the through hole of the housing base; and
a gasket disposed on the close contact portion at a location sandwiched between the close contact portion and the circumference of the through hole of the housing base.

2. The power converting apparatus according to claim 1, wherein the grommet supporting member is configured to hermetically seal the through hole of the housing base.

3. The power converting apparatus according to claim 2, wherein the grommet supporting member further comprises:
at least one linkage coupling the holder and the housing to one another.

4. The power converting apparatus according to claim 3, wherein the housing base has a width direction, and the housing comprises housing side walls on respective sides of the housing base in the width direction, and
wherein the at least one linkage comprises a plurality of linkages coupling the holder of the grommet supporting member to the housing side walls, the housing side walls being disposed on respective sides of the holder in the width direction.

5. The power converting apparatus according to claim 4, wherein the grommet supporting member comprises a plurality of grommet supporting members supporting a plurality of grommets.

6. The power converting apparatus according to claim 4, further comprising a reactor in the air duct,
wherein the cable comprises a lead wire for the reactor, and
wherein the grommet supporting member is disposed in the air duct.

7. The power converting apparatus according to claim 3, wherein the housing base has a width direction, and the housing comprises housing side walls on respective sides of the housing base in the width direction, and
wherein the at least one linkage comprises a plurality of linkages, the plurality of linkages coupling the holder of the grommet supporting member to the housing side walls.

8. The power converting apparatus according to claim 7, wherein the grommet supporting member comprises a plurality of grommet supporting members supporting a plurality of grommets.

9. The power converting apparatus according to claim 7, further comprising a reactor in the air duct,
wherein the cable comprises a lead wire for the reactor, and
wherein the grommet supporting member is disposed in the air duct.

10. The power converting apparatus according to claim 3, wherein the grommet supporting member comprises a plurality of grommet supporting members supporting a plurality of grommets.

11. The power converting apparatus according to claim 3, further comprising a reactor in the air duct,
wherein the cable comprises a lead wire for the reactor, and
wherein the grommet supporting member is disposed in the air duct.

12. The power converting apparatus according to claim 2, wherein the grommet supporting member comprises a plurality of grommet supporting members supporting a plurality of grommets.

13. The power converting apparatus according to claim 12, further comprising a reactor in the air duct,
wherein the cable comprises a lead wire for the reactor, and
wherein the grommet supporting member is disposed in the air duct.

14. The power converting apparatus according to claim 2, further comprising a reactor in the air duct,
wherein the cable comprises a lead wire for the reactor, and
wherein the grommet supporting member is disposed in the air duct.

15. The power converting apparatus according to claim 1, wherein the grommet supporting member is configured to support a plurality of grommets.

16. The power converting apparatus according to claim 15, further comprising a reactor in the air duct,
wherein the cable comprises a lead wire for the reactor, and
wherein the grommet supporting member is disposed in the air duct.

17. The power converting apparatus according to claim 1, further comprising a reactor in the air duct,
wherein the cable comprises a lead wire for the reactor, and
wherein the grommet supporting member is disposed in the air duct.

* * * * *